United States Patent
Deguchi

(10) Patent No.: US 8,008,978 B2
(45) Date of Patent: Aug. 30, 2011

(54) OSCILLATOR CIRCUIT AND MEMORY SYSTEM

(75) Inventor: Hiroshi Deguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 57 days.

(21) Appl. No.: 12/644,772

(22) Filed: Dec. 22, 2009

(65) Prior Publication Data

US 2010/0194484 A1  Aug. 5, 2010

(30) Foreign Application Priority Data

Feb. 4, 2009 (JP) .................................. 2009-024103

(51) Int. Cl.
*H03B 5/20* (2006.01)
*H03B 5/24* (2006.01)
*H03K 3/02* (2006.01)
*H03K 3/26* (2006.01)
*H03L 1/00* (2006.01)
*H03L 7/02* (2006.01)
*H03L 7/04* (2006.01)
*H03L 7/06* (2006.01)

(52) U.S. Cl. .......... 331/1 R; 331/34; 331/111; 331/143; 331/177 R; 331/186

(58) Field of Classification Search .................. 331/1 R, 331/8, 10, 11, 15–17, 34, 111, 143, 175, 331/177 R, 185, 186
See application file for complete search history.

(56) References Cited

U.S. PATENT DOCUMENTS

| 5,491,440 A | 2/1996 | Uehara et al. |
| 7,456,694 B2 * | 11/2008 | Wu .................................. 331/16 |
| 2001/0001543 A1 * | 5/2001 | Sasaki ............................ 327/101 |

FOREIGN PATENT DOCUMENTS

| JP | 2006-345405 | 12/2006 |
| JP | 2007-96410 | 4/2007 |

* cited by examiner

*Primary Examiner* — David Mis
(74) *Attorney, Agent, or Firm* — Oblon, Spivak, McClelland, Maier & Neustadt, L.L.P.

(57) ABSTRACT

An oscillator circuit generates a constant delay time by use of a current source and a load element to determine a frequency of a clock. The oscillator circuit includes an integrator which integrates the clock, a first comparator which compares an output voltage of the integrator with a reference voltage, and a variable current source which changes a current in accordance with the comparison result of the first comparator. The frequency is corrected in accordance with the current of the variable current source.

16 Claims, 4 Drawing Sheets

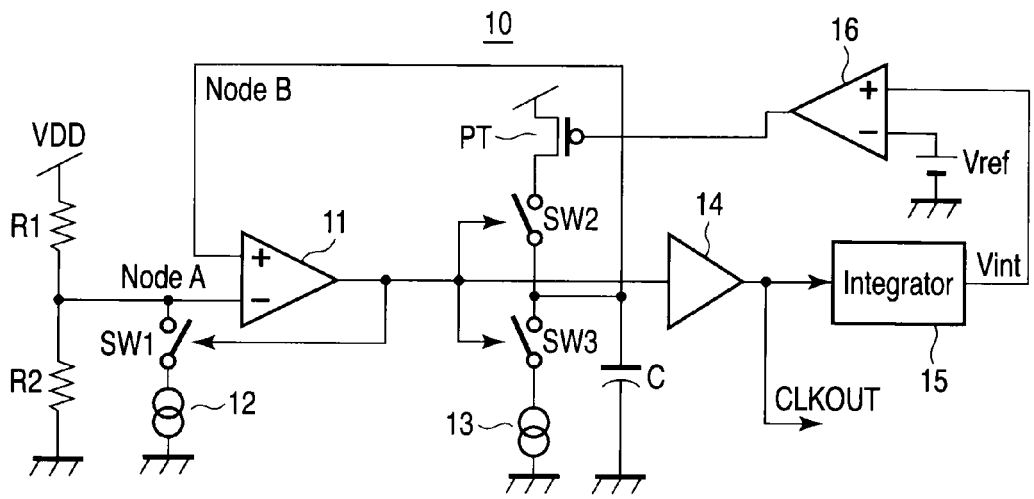
F I G. 1
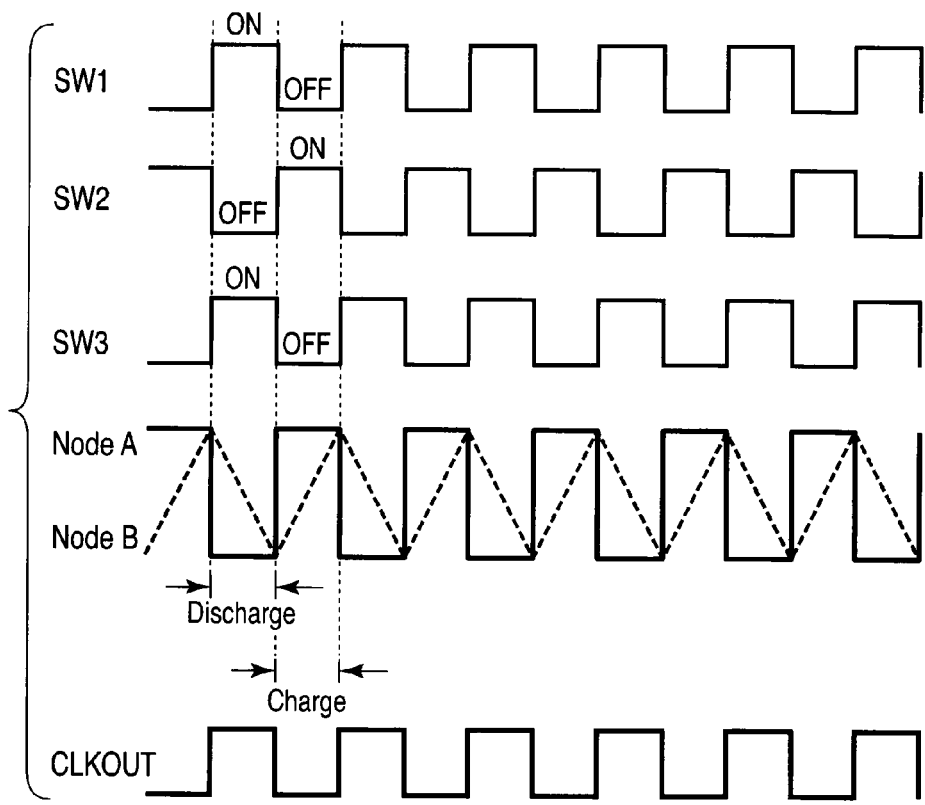
F I G. 2

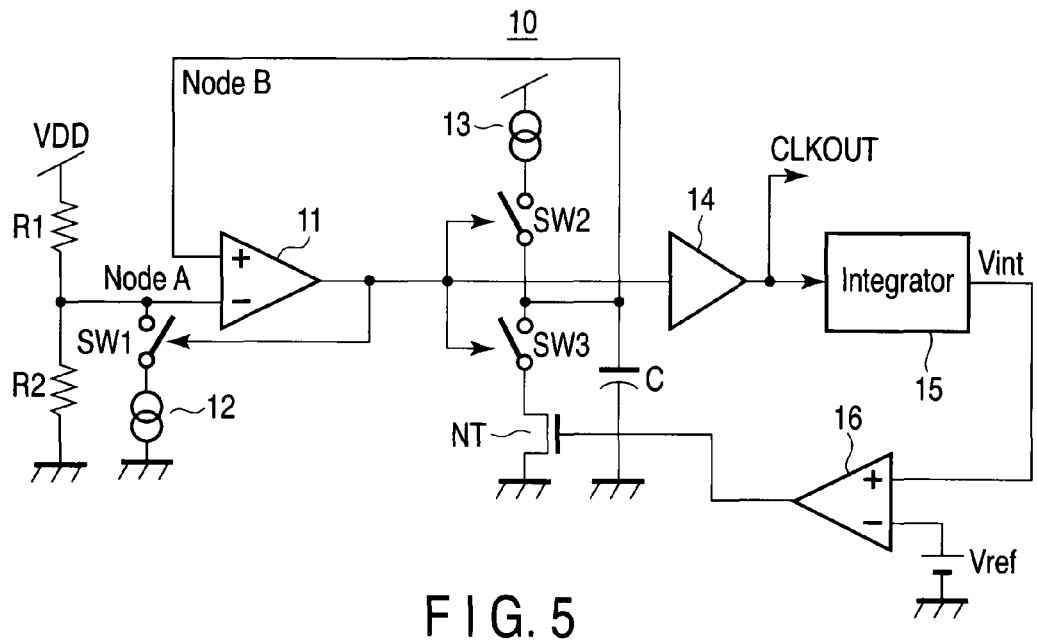
F I G. 5
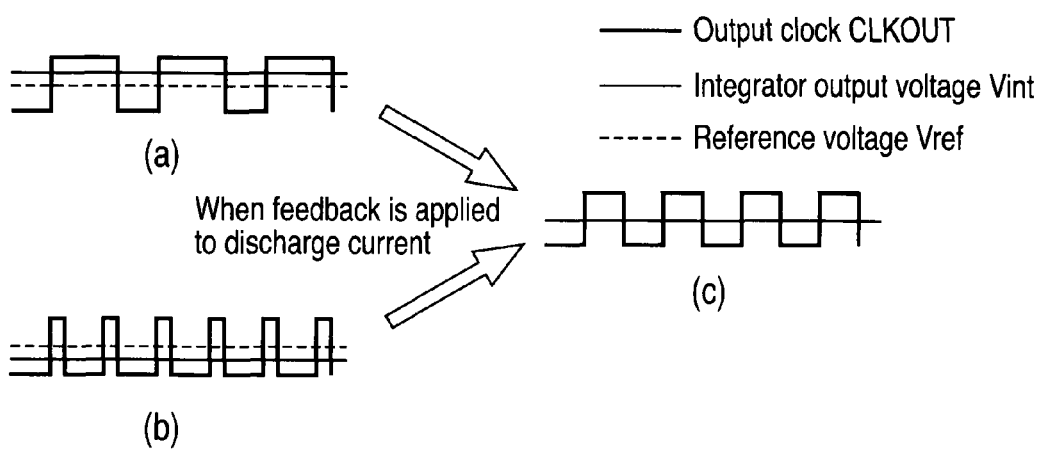
F I G. 6

US 8,008,978 B2

OSCILLATOR CIRCUIT AND MEMORY SYSTEM

CROSS-REFERENCE TO RELATED APPLICATIONS

This application is based upon and claims the benefit of priority from prior Japanese Patent Application No. 2009-024103, filed Feb. 4, 2009, the entire contents of which are incorporated herein by reference.

BACKGROUND OF THE INVENTION

1. Field of the Invention

The present invention relates to an oscillator circuit, and a memory system comprising the same. For example, the present invention relates to an oscillator circuit for correcting the frequency or duty ratio of a clock.

2. Description of the Related Art

In a large-scale integrated (LSI) circuit, a clock is a referential signal for controlling operation, and the timing adjustment of the clock becomes important along with the advance of the LSI circuit. This clock is generated by, for example, an oscillator.

For example, the frequency and duty ratio of the clock are determined by a charge current and a discharge current for a load element. However, if the balance between the charge current and the discharge current is lost because of process variations or because of the variation of an operation environment including a power supply voltage and the temperature, the ratio between the high-level time and low-level time of the clock varies. As a result, the duty ratio varies.

Conventionally, in order to suppress the variation of the duty ratio, a frequency twice as high as the frequency of a necessary clock is generated, and this clock is divided by a divider so that the high-level time and low-level time of the clock may be equal. When this method is used, a frequency twice as high as the frequency of a necessary clock has to be generated, so that current consumption increases. Moreover, the generated clock has to be divided, which is disadvantageous to acceleration.

One document (Jpn. Pat. Appln. KOKAI Publication No. 2006-345405) discloses a duty ratio variable circuit which varies the slew rate of an input signal to change the duty ratio of an output pulse.

BRIEF SUMMARY OF THE INVENTION

According to an aspect of the present invention, there is provided an oscillator circuit which generates a constant delay time by use of a current source and a load element to determine a frequency of a clock, the oscillator circuit comprising:

an integrator which integrates the clock;

a first comparator which compares an output voltage of the integrator with a reference voltage; and a variable current source which changes a current in accordance with the comparison result of the first comparator, wherein the frequency is corrected in accordance with the current of the variable current source.

According to an aspect of the present invention, there is provided a memory system comprising:

a memory which stores data; and a controller including an oscillator circuit which generates a constant delay time by use of a current source and a load element to determine a frequency of a clock, the controller transferring data to the memory in accordance with the clock, wherein the oscillator circuit comprises:

an integrator which integrates the clock;

a first comparator which compares an output voltage of the integrator with a reference voltage; and a variable current source which changes a current in accordance with the comparison result of the first comparator, the frequency being corrected in accordance with the current of the variable current source.

BRIEF DESCRIPTION OF THE SEVERAL VIEWS OF THE DRAWING

FIG. 1 is a circuit diagram showing the configuration of an oscillator circuit 10 according to a first embodiment of the invention;

FIG. 2 is a timing chart showing the operations of switches SW1 to SW3;

FIG. 5 is a circuit diagram showing the configuration of an oscillator circuit 10 according to a second embodiment of the invention;

FIG. 6 is a diagram explaining clock correcting operation in the case where a feedback is applied to a discharge current for a capacitor C;

DETAILED DESCRIPTION OF THE INVENTION

Figure 3:
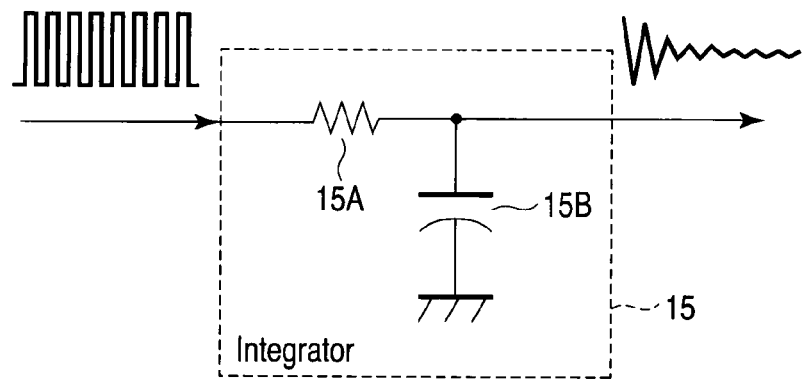
FIG. 3 is a circuit diagram showing one example of an integrator 15.

The embodiments of the present invention will be described hereinafter with reference to the accompanying drawings. In the description which follows, the same or functionally equivalent elements are denoted by the same reference numerals, to thereby simplify the description.

First Embodiment

FIG. 1 is a circuit diagram showing the configuration of an oscillator circuit 10 according to a first embodiment of the invention. The oscillator circuit 10 comprises comparators 11 and 16, constant current sources 12 and 13, a buffer 14, an integrator 15, resistors R1 and R2, switches SW1 to SW3, a capacitor C as a load element, and a P-channel metal oxide semiconductor (MOS) transistor PT functioning as a variable current source. Each of the comparators 11 and 16 can be configured by using, for example, a differential amplifier.

One terminal of resistor R1 is connected to a power supply voltage terminal VDD. The other terminal of resistor R1 is connected to one terminal of resistor R2 via a node A. The other terminal of resistor R2 is grounded (connected to a ground voltage terminal VSS). One terminal of switch SW1 is connected to node A, and the other terminal thereof is connected to one terminal of the constant current source 12. The other terminal of the constant current source 12 is grounded. Finally, node A is connected to the inverting input of the comparator 11.

The source of the P-channel MOS transistor PT is connected to the power supply voltage terminal VDD, and the drain thereof is connected to one terminal of switch SW2. The other terminal of switch SW2 is connected to one terminal of switch SW3 via a node B. The other terminal of switch SW3 is connected to one terminal of the constant current source 13. The other terminal of the constant current source 13 is grounded. One electrode of the capacitor C is connected to node B, and the other electrode thereof is grounded.

The non-inverting input of the comparator 11 is connected to node B. The comparator 11 compares the voltage of node A with the voltage of node B. Then, the comparator 11 outputs a low-level voltage when the voltage of node A is higher than that of node B, while the comparator 11 outputs a high-level voltage when the voltage of node A is lower than that of node B. The on/off of switches SW1 to SW3 is controlled by the output of the comparator 11. Moreover, the output of the comparator 11 is connected to the input of the buffer 14.

The buffer 14 outputs a clock CLKOUT which is the output of the oscillator circuit 10, on the basis of the output of the comparator 11. The output of the buffer 14 is connected to the input of the integrator 15. The integrator 15 integrates the voltage input thereto. The output of the integrator 15 is connected to the non-inverting input of the comparator 16.

A reference voltage Vref is supplied to the inverting input of the comparator 16. The comparator 16 compares the output voltage of the integrator 15 with the reference voltage Vref. Then, the comparator 16 outputs a control signal corresponding to the difference between the output voltage of the integrator 15 and the reference voltage Vref. The output of the comparator 16 is connected to the gate of the MOS transistor PT.

Next, the operation of the oscillator circuit 10 having the above configuration is described. FIG. 2 is a timing chart showing the operations of switches SW1 to SW3.

When the voltage of node B is lower than that of node A, switch SW1 is turned off, switch SW2 is turned on and switch SW3 is turned off by a control signal supplied from the comparator 11. When switch SW1 is off, a reference voltage is applied to node A. This reference voltage is derived from resistance division between the power supply voltage terminal VDD and the ground voltage terminal VSS by resistors R1 and R2. When switch SW2 is turned on and switch SW3 is turned off, the capacitor C is charged by the MOS transistor PT.

If the capacitor C is continuously charged and the voltage of node B becomes higher than that of node A, the output of the comparator 11 shifts to a high level. Accordingly, the clock CLKOUT shifts to a high level. When the output of the comparator 11 is at a high level, switch SW1 is turned on, switch SW2 is turned off and switch SW3 is turned on. When switch SW1 is turned on, a current is drawn by the constant current source 12 from the reference voltage which has been derived from the resistance division by resistors R1 and R2, such that a voltage stepped down from the reference voltage by a given voltage is applied to node A. If switch SW2 is turned off and switch SW3 is turned on, the capacitor C is discharged by the constant current source 13.

If the capacitor C is continuously discharged and the voltage of node B finally becomes lower than that of node A, the output of the comparator 11 shifts to a low level. Accordingly, the clock CLKOUT shifts to a low level. When the output of the comparator 11 is at a low level, switch SW1 is turned off, switch SW2 is turned on and switch SW3 is turned off. When switch SW1 is off, a reference voltage is applied to node A. This reference voltage is derived from the resistance division between the power supply voltage terminal VDD and the ground voltage terminal VSS by resistors R1 and R2. When switch SW2 is turned on and switch SW3 is turned off, the capacitor C is charged by the MOS transistor PT. The charging and discharging of the capacitor C are repeated by the above operation, whereby the clock CLKOUT shown in FIG. 2 is generated.

Here, in the present embodiment, the clock CLKOUT is input to the integrator 15 to integrate the voltage of the clock CLKOUT. FIG. 3 is a circuit diagram showing one example of the integrator 15. The integrator 15 is configured by, for example, an RC circuit using a resistor 15A and a capacitor 15B. As shown in FIG. 3, if the clock CLKOUT is input to the integrator 15, the integrator 15 integrates the clock CLKOUT and converts the clock CLKOUT into a voltage.

An output voltage Vint of the integrator 15 is applied to the non-inverting input of the comparator 16. The P-channel MOS transistor PT changes its resistance in accordance with a gate voltage applied to the gate thereof. That is, the MOS transistor PT can change, in accordance with its gate voltage, a current to be supplied to the capacitor C, so that the MOS transistor PT functions as a variable current source.

Figure 4:
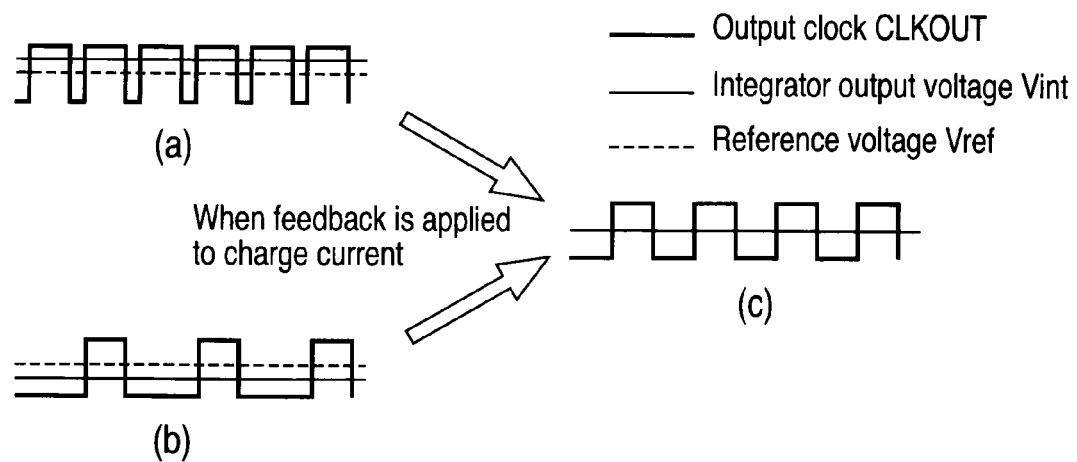
FIG. 4 is a diagram explaining clock correcting operation in the case where a feedback is applied to a charge current for a capacitor C.

A specific example of clock correcting operation in the oscillator circuit 10 is described below. FIG. 4 is a diagram explaining the clock correcting operation in the case where a feedback is applied to a charge current for the capacitor C. The oscillator circuit 10 in FIG. 1 uses the constant current source 13 to discharge the capacitor C, so that the high-level time of the clock CLKOUT corresponding to a discharging time is constant in FIGS. 4(a) and 4(b).

FIG. 4(a) shows an example of the clock CLKOUT having a short low-level time. That is, the pulse interval of the clock CLKOUT is short. In the case of such a clock CLKOUT, the output voltage Vint of the integrator 15 is higher than the reference voltage Vref. The comparator 16 compares the output voltage Vint of the integrator 15 with the reference voltage Vref, and supplies the MOS transistor PT with a control signal corresponding to the difference between the voltages.

At this point, the gate voltage of the MOS transistor PT increases, and the current driving force of the MOS transistor PT decreases accordingly. Then, the charging time of the capacitor C increases, such that the low-level time of the clock CLKOUT increases. Consequently, as shown in FIG. 4(c), the clock CLKOUT in which the high-level time is equal to the low-level time is generated.

FIG. 4(b) shows an example of the clock CLKOUT having a long low-level time. That is, the pulse interval of the clock CLKOUT is long. In the case of such a clock CLKOUT, the output voltage Vint of the integrator 15 is lower than the reference voltage Vref. The comparator 16 compares the output voltage Vint of the integrator 15 with the reference voltage Vref, and supplies the MOS transistor PT with a control signal corresponding to the difference between the voltages.

At this point, the gate voltage of the MOS transistor PT decreases (the negative and absolute value increases), and the current driving force of the MOS transistor PT decreases accordingly. Then, the charging time of the capacitor C decreases, such that the low-level time of the clock CLKOUT decreases. Consequently, as shown in FIG. 4(c), the clock CLKOUT in which the high-level time is equal to the low-level time is generated.

Although the duty ratio is 50% in the example of FIG. 4, the duty ratio of the oscillator circuit 10 can be freely changed depending on the reference voltage Vref applied to the inverting input of the comparator 16. For example, when the duty ratio is set at 50%, the reference voltage Vref is set to be half the power supply voltage VDD. The reference voltage Vref can be set by the resistance division between the power supply voltage terminal VDD and the ground voltage terminal VSS. Any duty ratio can be set by changing the resistance division ratio.

As described above in detail, in the first embodiment, a feedback is applied to the charge current for the capacitor C to adjust the low-level time of the clock CLKOUT. That is, the clock CLKOUT is integrated by the integrator 15 and converted into a voltage. Then, depending on whether the output voltage Vint of the integrator 15 is higher than the reference voltage Vref, the current driving force of the P-channel MOS transistor PT for controlling the charge current for the capacitor C is determined.

Thus, according to the first embodiment, the variation of the frequency of the clock CLKOUT and the variation of the duty ratio can be corrected, such that a desired clock CLKOUT can be obtained. Moreover, a constant duty ratio can be maintained with no addition of a circuit for correcting the duty ratio. Further, there is no need for trimming to correct the duty ratio, leading to the reduction of a development process.

Furthermore, only a high-precision current source is used for the constant current source 13 for controlling a discharge current, in order to highly precisely set the high-level time of the clock CLKOUT. Then, a feedback circuit (the integrator 15 and the comparator 16) is used to adjust the low-level time to the high-level time of the clock CLKOUT, so that the clock CLKOUT having a small frequency variation and a small duty ratio variation can be generated. It is also possible to reduce the number of constant current sources.

Still further, as the finally generated clock CLKOUT is used to make a feedback correction, it is also possible to correct the frequency variation and the duty ratio variation resulting from the characteristics of the elements at the previous stage of the clock CLKOUT. Thus, the oscillator circuit 10 resistant to the variation of an environment including a power supply voltage and the temperature can be configured. Even if the element characteristics are changed by the variation of the environment, a high-precision clock CLKOUT can be generated.

Second Embodiment

In a second embodiment, a feedback is applied to a discharge current for a capacitor C to adjust the high-level time of a clock CLKOUT, such that a high-precision clock CLKOUT is generated.

FIG. 5 is a circuit diagram showing the configuration of an oscillator circuit 10 according to the second embodiment of the invention. Instead of the constant current source, the oscillator circuit 10 comprises an N-channel MOS transistor NT for controlling the discharge current for the capacitor C. A feedback circuit (an integrator 15 and a comparator 16) is connected to the gate of the N-channel MOS transistor NT. Only parts of the configuration of the oscillator circuit 10 that are different from the configuration in FIG. 1 are described below.

One terminal of a constant current source 13 is connected to a power supply voltage terminal VDD, and the other terminal thereof is connected to one terminal of a switch SW2. The other terminal of switch SW2 is connected to one terminal of a switch SW3 via a node B. The other terminal of switch SW3 is connected to the drain of the N-channel MOS transistor NT. The source of the N-channel MOS transistor NT is grounded, and the gate thereof is connected to the output of the comparator 16. The operations of switches SW1 to SW3 are the same as in the timing chart in FIG. 2.

A specific example of clock correcting operation in the oscillator circuit 10 is described below. FIG. 6 is a diagram explaining the clock correcting operation in the case where a feedback is applied to the discharge current for the capacitor C. The oscillator circuit 10 in FIG. 5 uses the constant current source 13 to charge the capacitor C, so that the low-level time of the clock CLKOUT corresponding to a charging time is constant in FIGS. 6(a) and 6(b).

FIG. 6(a) shows an example of the clock CLKOUT having a long high-level time. That is, the pulse width of the clock CLKOUT is large. In the case of such a clock CLKOUT, an output voltage Vint of the integrator 15 is higher than a reference voltage Vref. The comparator 16 compares the output voltage Vint of the integrator 15 with the reference voltage Vref, and supplies the MOS transistor NT with a control signal corresponding to the difference between the voltages.

At this point, the gate voltage of the MOS transistor NT increases, and the current driving force of the MOS transistor NT increases accordingly. Then, the discharging time of the capacitor C decreases, such that the high-level time of the clock CLKOUT decreases. Consequently, as shown in FIG. 6(c), the clock CLKOUT in which the high-level time is equal to the low-level time is generated.

FIG. 6(b) shows an example of the clock CLKOUT having a short high-level time. That is, the pulse width of the clock CLKOUT is small. In the case of such a clock CLKOUT, the output voltage Vint of the integrator 15 is lower than the reference voltage Vref. The comparator 16 compares the output voltage Vint of the integrator 15 with the reference voltage Vref, and supplies the MOS transistor NT with a control signal corresponding to the difference between the voltages.

At this point, the gate voltage of the MOS transistor NT decreases, and the current driving force of the MOS transistor NT decreases accordingly. Then, the discharging time of the capacitor C increases, such that the high-level time of the clock CLKOUT increases. Consequently, as shown in FIG. 6(c), the clock CLKOUT in which the high-level time is equal to the low-level time is generated.

As described above in detail, in the second embodiment, a feedback is applied to the discharge current for the capacitor C to adjust the high-level time of the clock CLKOUT. That is, the clock CLKOUT is integrated by the integrator 15 and converted into a voltage. Then, depending on whether the output voltage Vint of the integrator 15 is higher than the reference voltage Vref, the current driving force of the N-channel MOS transistor NT for controlling the discharge current for the capacitor C is determined.

Thus, according to the second embodiment, the variation of the frequency of the clock CLKOUT and the variation of the duty ratio can be corrected, such that a desired clock CLKOUT can be obtained.

Furthermore, only a high-precision current source is used for the constant current source 13 for controlling a charge current, in order to highly precisely set the low-level time of the clock CLKOUT. Then, the feedback circuit (the integrator 15 and the comparator 16) is used to adjust the high-level time to the low-level time of the clock CLKOUT, so that the clock CLKOUT having a small frequency variation and a small duty ratio variation can be generated. In respect of other advantages, the second embodiment is the same as the first embodiment.

Third Embodiment

Figure 7:
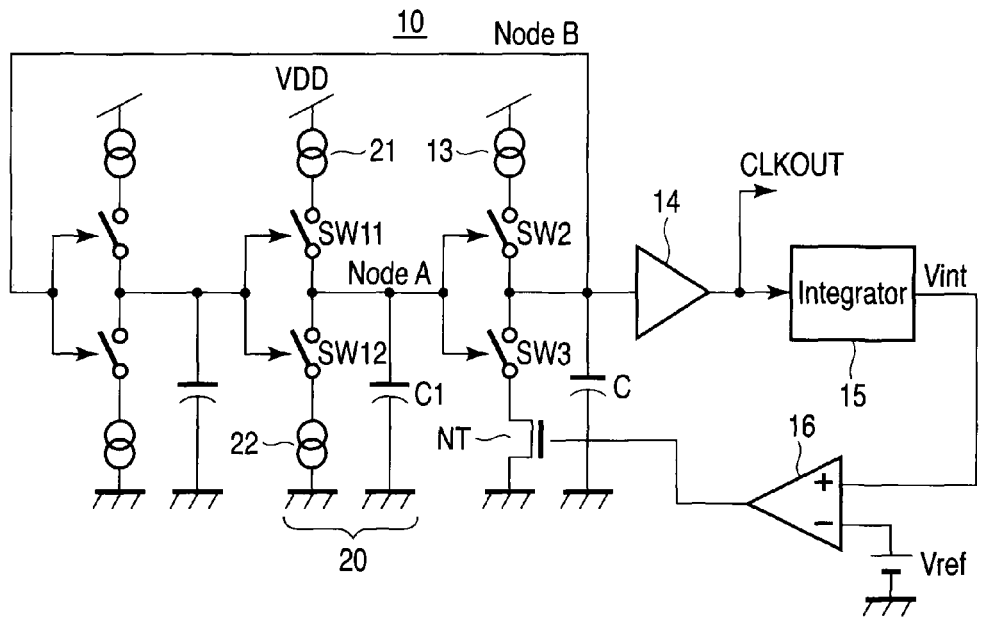
FIG. 7 is a circuit diagram showing the configuration of an oscillator circuit 10 according to a third embodiment of the invention.

In a configuration example of a third embodiment, the kind of oscillator for generating a clock is different from that of the oscillator in FIG. 1. FIG. 7 is a circuit diagram showing the configuration of an oscillator circuit 10 according to the third embodiment of the invention. That is, FIG. 7 shows an example of the configuration of the oscillator circuit 10 that uses a ring oscillator.

One terminal of a constant current source 21 is connected to a power supply voltage terminal VDD, and the other terminal thereof is connected to one terminal of a switch SW11. The other terminal of switch SW11 is connected to one terminal of a switch SW12 via a node A. The other terminal of switch SW12 is connected to one terminal of a constant current source 22. The other terminal of the constant current source 22 is grounded. One electrode of a capacitor C is connected to node A, and the other electrode thereof is grounded. Thus, one circuit section 20 is configured, and an odd number of circuit sections 20 are connected together in the form of a ring to configure the ring oscillator.

The charging switch SW11 and the discharging switch SW12 in which control terminals are connected to given capacitors operate in the following manner: For example, the charging switch SW11 is turned on when the charging of the capacitor is completed, while the discharging switch SW12 is turned on when the discharging of the capacitor is completed. Thus, the charging switch SW11 and the discharging switch SW12 are repeatedly turned on/off alternately.

Here, the circuit section at the final stage includes one constant current source and one variable current source. In the example of FIG. 7, the discharging constant current source is replaced with the variable current source including an N-channel MOS transistor NT, as in FIG. 5. The charging constant current source may be replaced with a variable current source including a P-channel MOS transistor PT as in FIG. 1.

A node B is connected to the input of a buffer 14. The buffer 14 outputs a clock CLKOUT. Specifically, the oscillator circuit 10 in FIG. 7 outputs a clock CLKOUT which is at a high level when the voltage of the capacitor C is greater than or equal to the threshold voltage of the buffer 14 and which is at a low level when the voltage of the capacitor C is below the threshold voltage.

As in the second embodiment, a feedback circuit (an integrator 15 and a comparator 16) is connected between the output of the buffer 14 and the gate of the N-channel MOS transistor NT. When the oscillator circuit 10 has such a configuration, effects similar to the effects in the previously described embodiments can be obtained.

In addition, various kinds of configurations other than the configurations in FIG. 1 and FIG. 7 can be used for an oscillating part of the oscillator circuit for actually generating a clock.

Fourth Embodiment

The oscillator circuits 10 shown in the first to third embodiments can generate a high-precision clock CLKOUT, so that the oscillator circuit 10 can be mounted on an LSI circuit performing accelerated and advanced operation in order to improve the performance of the LSI circuit. In a configuration example of the fourth embodiment, the oscillator circuit 10 in each of the previously described embodiments is applied to a memory system.

Various forms of memory systems are applicable. Among the various memory systems, a memory card is described by way of example in the present embodiment. The memory card is configured to be detachable from a slot provided in a host device, and operates while being attached to the host device. However, the present invention is not limited to the memory card. The memory system and the host device may be configured as one LSI.

Figure 8:
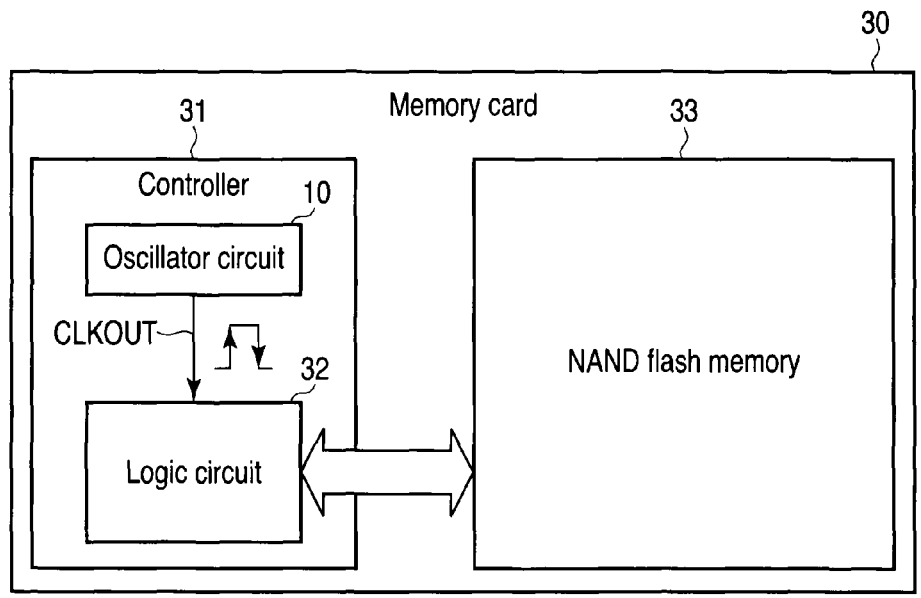
FIG. 8 is a block diagram showing the configuration of a memory card 30 according to a fourth embodiment of the invention.

FIG. 8 is a block diagram showing the configuration of a memory card 30 according to the fourth embodiment of the invention. The memory card 30 comprises a nonvolatile memory 33, and a controller 31 for controlling the nonvolatile memory 33. For example, an electrically rewritable NAND flash memory is used as the nonvolatile memory 33.

The controller 31 includes one of the oscillator circuits 10 shown in the first to third embodiments, and a logic circuit 32. The controller 31 writes data to the NAND flash memory 33, reads data from the NAND flash memory 33, and erases data in the NAND flash memory 33. At this point, the controller 31 transfers the data using the clock CLKOUT generated by the oscillator circuit 10.

Specific operation of the controller 31 is described below. When writing data, the controller 31 sends the data to the NAND flash memory 33 in synchronization with (in response to) both edges, that is, both the rising edge and falling edge of the clock CLKOUT. When reading data, the controller 31 receives the data from the NAND flash memory 33 in synchronization with (in response to) both edges of the clock CLKOUT. Such operations make it possible for the memory card 30 to write data to the NAND flash memory 33 and read data from the NAND flash memory 33 at higher speed.

Here, the oscillator circuit 10 generates a clock CLKOUT having a small frequency variation and a small duty ratio variation. Thus, the memory card 30 can write data and read data without any erroneous operation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An oscillator circuit which generates a constant delay time by use of a current source and a load element to determine a frequency of a clock, the oscillator circuit comprising:
   an integrator which integrates the clock;
   a first comparator which compares an output voltage of the integrator with a reference voltage; and
   a variable current source which changes a current in accordance with the comparison result of the first comparator,
   wherein the frequency is corrected in accordance with the current of the variable current source.

2. The oscillator circuit according to claim 1, further comprising:
   a constant current source;
   a first switch which switches an electrical connection between the constant current source and a first node electrically connected to the load element; and
   a second switch which switches an electrical connection between the first node and the variable current source.

3. The oscillator circuit according to claim 2, wherein
   the load element is a capacitor,
   the constant current source discharges the capacitor, and
   the variable current source charges the capacitor.

4. The oscillator circuit according to claim 3, wherein
   the variable current source is a P-channel MOS transistor,
   the MOS transistor including a source electrically connected to a power source, a gate electrically connected to an output of the first comparator, and a drain electrically connected to the second switch.

5. The oscillator circuit according to claim 2, wherein
   the load element is a capacitor,
   the constant current source charges the capacitor, and
   the variable current source discharges the capacitor.

6. The oscillator circuit according to claim 5, wherein
   the variable current source is an N-channel MOS transistor, the MOS transistor including a source electrically connected to a power source, a gate electrically connected to an output of the first comparator, and a drain electrically connected to the second switch.

7. The oscillator circuit according to claim 2, further comprising a second comparator which includes a first input electrically connected to the first node and a second input electrically connected to a second node, the second comparator comparing a voltage of the first input with a voltage of the second input and outputting the clock as the comparison result, wherein a reference voltage and a ground voltage are alternately applied to the second node in accordance with the clock.

8. The oscillator circuit according to claim 7, further comprising a buffer electrically connected between an output of the second comparator and an input of the integrator.

9. A memory system comprising:
a memory which stores data; and
a controller including an oscillator circuit which generates a constant delay time by use of a current source and a load element to determine a frequency of a clock, the controller transferring data to the memory in accordance with the clock,
wherein the oscillator circuit comprises:
an integrator which integrates the clock;
a first comparator which compares an output voltage of the integrator with a reference voltage; and
a variable current source which changes a current in accordance with the comparison result of the first comparator, the frequency being corrected in accordance with the current of the variable current source.

10. The memory system according to claim 9, wherein the oscillator circuit further comprises:
a constant current source;
a first switch which switches an electrical connection between the constant current source and a first node electrically connected to the load element; and
a second switch which switches an electrical connection between the first node and the variable current source.

11. The memory system according to claim 10, wherein the load element is a capacitor,
the constant current source discharges the capacitor, and
the variable current source charges the capacitor.

12. The memory system according to claim 11, wherein the variable current source is a P-channel MOS transistor, the MOS transistor including a source electrically connected to a power source, a gate electrically connected to an output of the first comparator, and a drain electrically connected to the second switch.

13. The memory system according to claim 10, wherein the load element is a capacitor,
the constant current source charges the capacitor, and
the variable current source discharges the capacitor.

14. The memory system according to claim 13, wherein the variable current source is an N-channel MOS transistor, the MOS transistor including a source electrically connected to a power source, a gate electrically connected to an output of the comparator, and a drain electrically connected to the second switch.

15. The memory system according to claim 10, wherein the oscillator circuit further comprises a second comparator which includes a first input electrically connected to the first node and a second input electrically connected to a second node, the second comparator comparing a voltage of the first input with a voltage of the second input and outputting the clock as the comparison result,
a reference voltage and a ground voltage being alternately applied to the second node in accordance with the clock.

16. The memory system according to claim 15, further comprising a buffer electrically connected between an output of the second comparator and an input of the integrator.

* * * * *